United States Patent
Booth

(10) Patent No.: US 7,026,879 B2
(45) Date of Patent: Apr. 11, 2006

(54) LOOP FILTER FOR USE IN A PHASE-LOCKED LOOP

(75) Inventor: Richard V. Booth, Riegelsville, PA (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 10/813,291

(22) Filed: Mar. 30, 2004

(65) Prior Publication Data

US 2005/0219001 A1    Oct. 6, 2005

(51) Int. Cl.
*H03L 7/08*    (2006.01)
*H03D 3/24*    (2006.01)

(52) U.S. Cl. .................. 331/17; 331/25; 327/157; 327/156; 375/376

(58) Field of Classification Search .............. 331/1 A, 331/17, 8, 25; 327/156–157; 375/373, 376
See application file for complete search history.

(56) References Cited

U.S. PATENT DOCUMENTS

| 6,292,061 | B1* | 9/2001 | Qu ............................... 331/17 |
| 6,826,246 | B1* | 11/2004 | Brown et al. ................ 375/376 |
| 6,828,654 | B1* | 12/2004 | Tam et al. .................... 257/532 |
| 2003/0124810 | A1 | 7/2003 | Tam et al. |

* cited by examiner

*Primary Examiner*—Dinh T. Le

(57) ABSTRACT

An integrated circuit including at least one loop filter for use in a phase-locked loop, the loop filter including a resistive element and at least one metal-oxide-semiconductor (MOS) transistor configured as a capacitor having a first capacitance associated therewith. The MOS transistor is connected between a voltage source and an input of the loop filter via the resistive element. The loop filter further includes a bias circuit connected to the MOS transistor. The bias circuit is configured for maintaining a substantially constant reference voltage across the MOS transistor, the reference voltage being selected so as to bias the MOS transistor in a designated region of operation. In this manner, the first capacitance is substantially optimized per unit area.

23 Claims, 2 Drawing Sheets

LOOP FILTER FOR USE IN A PHASE-LOCKED LOOP

FIELD OF THE INVENTION

The present invention relates generally to integrated circuits (ICs), and more particularly relates to loop filters for use in phase-locked loops (PLLs).

BACKGROUND OF THE INVENTION

Loop filters are commonly utilized as functional blocks in PLLs, among other types of circuits. FIG. 1 illustrates a conventional PLL 100 comprised of three functional blocks, namely, a phase detector 102, a loop filter 104, and a voltage-controlled oscillator (VCO) 106. These three blocks 102, 104, 106 are interconnected in a feedback arrangement as shown. Such PLLs may be implemented in ICs used in a wide variety of electronic systems and applications, including, for example, communication systems. The basic theory and principle of operation of PLLs are well known, as described, for example, in Alan B. Grebene, "Bipolar and MOS Analog Integrated Circuit Design," pp. 627–678 (John Wiley & Sons 1984), which is incorporated herein by reference. Consequently, the theory and principle of operation of PLLs in general will not be presented in detail herein.

The loop filter has a strong influence on the overall performance characteristics of the PLL. For example, when the PLL is in a locked state, a transfer function of the loop filter, along with a loop gain, determine both the transient response and the frequency response characteristics of the PLL. When the PLL is not locked, the loop filter has a dominant effect in controlling the ability of the PLL to lock to an input signal. The loop filter may further significantly affect, for example, PLL bandwidth, reference jitter rejection and/or power supply jitter rejection. In a radio frequency (RF) application, for example, the loop filter may additionally function to filter out difference frequency components associated with undesired signals which are far removed from a free-running frequency of the VCO. In this manner, the loop filter enhances the interference rejection characteristics of the PLL. The PLL essentially captures only those signals that are close to the free-running frequency of the VCO, such that a difference frequency $\Delta f$ falls approximately within the bandwidth of the loop filter, where $\Delta f$ may be defined as a magnitude of the difference between the free-running frequency of the VCO and the frequency of an input signal $V_S(t)$ applied to the PLL.

Since the loop filter 104 is typically configured as a low-pass filter having a bandwidth of about one megahertz (MHz) or so, it is necessary for the loop filter to employ relatively large value capacitors. The large value capacitors are often implemented as metal-oxide semiconductor field-effect transistors (MOSFETs). The MOSFET gate oxide generally offers the thinnest oxide, and thus the highest capacitance density, available for a given IC fabrication process. For example, a conventional 0.13 micron complementary metal-oxide-semiconductor (CMOS) IC fabrication process provides MOSFET devices having a gate oxide thickness of about 17 angstroms.

As IC fabrication process dimensions are scaled down, gate oxide thickness generally shrinks accordingly, which typically causes an increase in tunneling through the thin gate oxide. As the gate oxide thickness falls below about 20 angstroms, this gate oxide tunneling often produces a significant leakage current which can overwhelm the PLL, causing the PLL to have difficulty achieving lock. Even when lock is established in the PLL, the leakage current typically appears as a static phase offset between the input signal $V_S(t)$ and a VCO output signal $V_O(t)$ fed back to the phase detector. This static phase offset directly translates to jitter on the output signal of the PLL.

Previous attempts to reduce the leakage current attributed to the thin-oxide MOSFET capacitors employed in the loop filter of a PLL have involved a compensation scheme which accounts for an average leakage current in the loop filter. This approach, however, requires the inclusion of additional compensation circuitry in the PLL which is often complex and is thus undesirable. Furthermore, the compensation circuitry may suffer from mismatch and must therefore be calibrated to a reference device. Since the compensation circuitry generally only adjusts for average leakage current in the loop filter, any uncompensated leakage current will appear as phase offset and jitter in the output signal generated by the PLL.

Patent Publication No. US 2003/0124810 A1 to Tam et al. (hereinafter "Tam") addresses a solution for reducing leakage current in a single-loop PLL resulting from the thin-oxide MOSFET capacitor in the loop filter by replacing the thin-oxide capacitor with a thick-oxide N-type MOSFET (NMOS) device. In the Tam PLL configuration, the voltage for controlling the VCO is placed directly across the thick-oxide NMOS device. This control voltage can vary widely and, in some instances, the thick-oxide NMOS device may not be able to turn on depending on the control voltage level.

To solve this problem, Tam discloses a methodology for lowering the threshold voltage of the thick-oxide NMOS device by doping the gate terminal of the device with a P-type dopant. However, since the capacitance value of the thick-oxide NMOS device is significantly voltage dependent, the capacitance of the device will change with variations in the control voltage. Thus, not only does the Tam methodology require additional IC fabrication steps to modify the conventional thick-oxide device, thereby increasing the manufacturing cost of the PLL, but the transfer characteristics of the loop filter will vary widely as a function of the VCO control voltage, which is undesirable.

There exists a need, therefore, for an improved loop filter for use in a PLL, that does not suffer from one or more of the problems exhibited by conventional PLL arrangements. Moreover, it would be desirable if the improved loop filter were compatible with existing IC fabrication process technologies.

SUMMARY OF THE INVENTION

The present invention meets the above-noted need by providing, in an illustrative embodiment, improved techniques for maintaining a high capacitance per unit area without significantly increasing leakage current in a loop filter used in a PLL. Furthermore, the techniques of the invention do not require the addition of complex compensation circuitry to the PLL and may be implemented using conventional IC fabrication process technologies.

In accordance with one aspect of the invention, a loop filter for use in a phase-locked loop circuit includes a resistive element and at least one metal-oxide-semiconductor (MOS) transistor configured as a capacitor having a first capacitance associated therewith, the MOS transistor being connected between a voltage source and an input of the loop filter via the resistive element. The loop filter further includes a bias circuit connected to the MOS transistor. The bias circuit is configured for maintaining a substantially constant reference voltage across the MOS transistor, the reference voltage being selected so as to bias the MOS transistor in a designated region of operation. In this manner, the first capacitance is substantially optimized per unit area.

In accordance with another aspect of the invention, a PLL includes a variable frequency generator including a first input for receiving a first control signal presented thereto, a second input for receiving a second control input presented thereto, and an output for generating an output signal having a frequency associated therewith which varies as a function of the first and second control signals. The PLL further includes a phase-frequency detector including a first input for receiving a reference signal having a reference frequency associated therewith, a second input for receiving at least a portion of the output signal from the variable frequency oscillator, and an output for generating the first control signal. The first control signal is representative of a difference between the reference frequency and the frequency of the output signal. The PLL further includes a loop filter including an input for receiving the first control signal and an output for generating the second control signal. The loop filter includes a resistive element and at least one MOS transistor configured as a capacitor having a first capacitance associated therewith. The MOS transistor is connected between a voltage source and an input of the loop filter via the resistive element. The loop filter further includes a bias circuit connected to the MOS transistor, the bias circuit being configured for maintaining a substantially constant reference voltage across the MOS transistor. The reference voltage is selected so as to bias the MOS transistor in a designated region of operation for optimizing the first capacitance per unit area.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative dual-loop PLL circuit. It should be understood, however, that the present invention is not limited to this or any particular PLL architecture. Rather, the invention is more generally applicable to techniques for advantageously reducing leakage current in a loop filter of a PLL. As previously stated, this leakage current often directly correlates to jitter and phase offset in the output signal generated by the PLL, and therefore a reduction in leakage current translates to a beneficial reduction in jitter and phase error in the PLL output signal. Furthermore, while the techniques of the invention are described herein in the context of a CMOS IC fabrication process, the invention contemplates that other suitable alternative fabrication processes (e.g., BiCMOS) may be employed.

Figure 1:
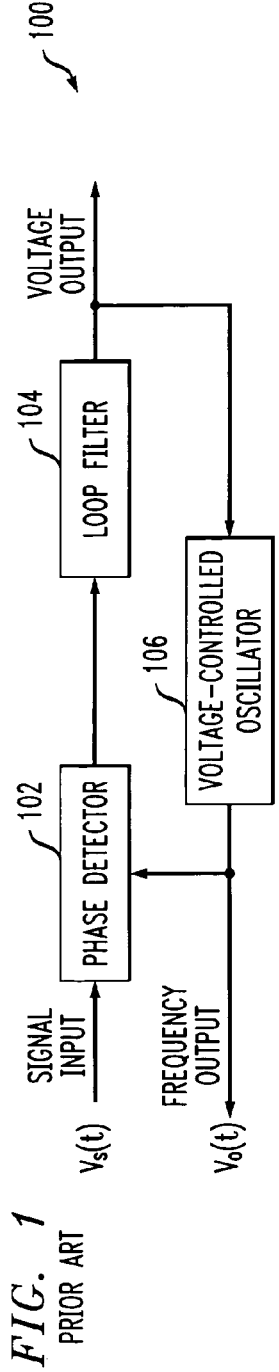
FIG. 1 is a block diagram of a conventional PLL system.
Figure 2:
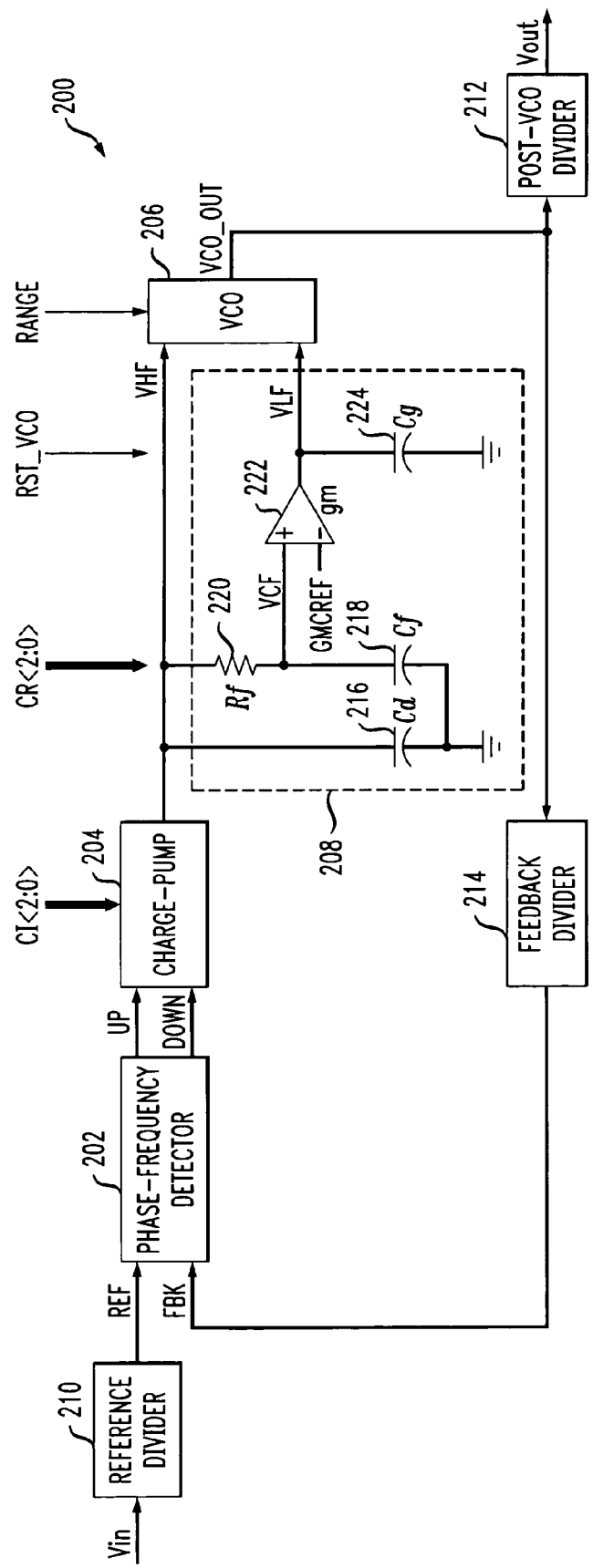
FIG. 2 is a block diagram of an exemplary PLL circuit, formed in accordance with an illustrative embodiment of the invention.

FIG. 2 is a block diagram illustrating an exemplary PLL 200 in which the techniques of the present invention are implemented. The exemplary PLL 200 comprises first and second control loops and thus may be referred to as a dual-loop architecture, although the present invention is not limited to such a configuration. The first control loop is considered to be a high-frequency path (e.g., operating at or near the frequency of an input reference signal Vin applied to the PLL) that is capable of substantially tracking the input reference signal Vin and providing fine adjustments around a center frequency of a VCO 206 in the PLL 200. The PLL is not limited to any particular frequency range of operation. The second control loop, by contrast, is a low-frequency path (e.g., operating at a frequency on the order of hundreds of hertz) that is capable of providing a substantially continuous slow calibration of the center frequency of the VCO 206. A more detailed description of the two control loops of the PLL 200 is presented below.

The first control loop in the exemplary PLL 200 comprises a phase-frequency detector (PFD) 202, a charge pump 204 and VCO 206. The PFD 202 is preferably configured for receiving a first input signal REF, comprising the input reference signal Vin, or a multiple thereof, and a second input signal FBK, comprising an output signal VCO_OUT generated by the VCO 206, or a multiple thereof, and generating one or more pulse signals, UP and DN, indicative of a difference in phase and frequency between the two input signals REF and FBK. The charge pump 204, together with a loop filter 208, preferably generates a first VCO control signal VHF on the basis of, at least in part, the pulse signals UP and DN. One or more of the PFD 202, charge pump 204 and VCO 206 may be implemented in a conventional fashion, as will be understood by those skilled in the art. The second control loop in the PLL 200 comprises the PFD 202, charge pump 204, a loop filter 208, and VCO 206. The loop filter 208 is preferably a low-pass filter configurable for receiving at least a portion of the first VCO control signal VHF and generating a second VCO control signal VLF which is supplied to the VCO 206.

The VCO 206 is preferably configured such that the output signal VCO_OUT varies, at least in part, as a function of both the first and second VCO control signals VHF and VLF, respectively. It is to be appreciated that the amount of effect that each of the VCO control signals VHF and VLF has on the VCO output signal VCO_OUT may not be equal. For instance, a ratio of the change in VCO control signal VHF to the change in frequency of the VCO output signal VCO_OUT, may be greater than, less than, or the same as a ratio of the change in VCO control signal VLF to the change in frequency of the VCO output signal VCO_OUT.

The PLL 200 may further include a reference divider 210 coupled to an input of the PFD 202. The reference divider 210 is preferably configurable for dividing the input reference signal Vin by a desired value. Likewise, the PLL 200 may include a post-VCO divider 212 coupled to the VCO 206 for scaling the output VCO signal VCO_OUT as desired. The PLL 200 preferably further comprises a feedback divider 214 coupled in the feedback path between the output of the VCO 206 and the input of the PFD 202. Like the reference divider 210 and post-VCO divider 212, the feedback divider 214 is preferably configurable for scaling the VCO output signal fed back to the PFD 202 by a desired value. The feedback divider 214, together with respective gains associated with the PFD 202, charge pump 204 and/or VCO 206, sets the open-loop gain of the PLL 200. One or more of the reference divider 210, post-VCO divider 212 and feedback divider 214 may be implemented in a conventional manner, such as, for example, using a programmable counter, although alternative divider circuits may also be employed.

As previously stated, loop filters used in PLLs often employ large value capacitors (e.g., greater than about 150 picofarad (pF)) implemented as thin-oxide MOSFET devices. These thin-oxide MOSFET device are typically used for setting certain characteristics of the filter, including, for example, corner frequency, stability, bandwidth, etc. Thin-oxide MOSFET devices have a higher capacitance value associated therewith for a given semiconductor area compared to thick-oxide MOSFET devices, but as gate oxide thickness is scaled down, leakage current resulting from tunneling through the thin oxide increases. This leakage current typically appears as a static phase offset between the input reference signal and the VCO output signal fed back to the PFD which translates to jitter on the VCO output signal.

Thick-oxide NMOS devices can be utilized to reduce the leakage current in the loop filter. However, thick-oxide NMOS devices generally cannot be simply substituted for traditional thin-oxide devices in the loop filter without either modifying the thick-oxide NMOS device itself or modifying the loop filter circuit, as will be described subsequently. Modifying the thick-oxide NMOS device, such as by doping the gate terminal to lower the threshold voltage of the device, adds additional steps to the IC fabrication process, which can significantly increase the cost of manufacturing the PLL and is thus undesirable. Moreover, since the capacitance value of the thick-oxide NMOS device is significantly voltage dependent, the capacitance of the device will undesirably vary with the VCO control voltage which is applied directly across the device, as stated above.

In accordance with one aspect of the invention, the loop filter 208 in PLL 200 preferably comprises a first capacitor 218 which is implemented using a thick-oxide MOSFET device configured to provide a capacitance Cf. A first terminal of capacitor 218 may be coupled to a negative supply voltage, which may be ground, and a second terminal of capacitor 218 is preferably coupled to a first VCO control voltage via a series resistor 220 having a resistance Rf. It is to be appreciated that capacitor 218 may alternatively be connected between the first VCO control voltage and essentially any substantially constant voltage source (e.g., a positive supply voltage, which may be VDD). Resistor 220 may be implemented as, for example, a monolithic resistor comprising polysilicon material, although resistor 220 may comprise an alternative resistive element, such as, for example, a MOSFET device. Together, resistor 220 and capacitor 218 control one or more characteristics of the loop filter 208, including, but not limited to, a damping factor D, which is a measure of a stability of the loop. The damping factor D may be determined, to at least a second order approximation, by the relation $$D = \frac{Rf}{2} \cdot \sqrt{Icp \cdot Kvco \cdot \frac{Cf}{M}},$$

where Icp is the charge pump current, Kvco is the VCO gain, and M is the feedback divider value. The bandwidth BW of the loop may be determined, to at least a second order approximation, by the relation $$BW = \frac{2\pi \cdot Rf \cdot Icp \cdot Kvco}{M}$$

By way of example only, in one embodiment of the invention, Rf is about 20 kilo (K) ohms and Cf is about 150 pF.

The loop filter 208 may comprise a second capacitor 216 which, like capacitor 218, is preferably implemented using a thick-oxide MOSFET device configured to have a capacitance Cd. Capacitor 216 is coupled between the VCO control signal VHF and ground (or an alternative voltage source) and functions, at least in part, to reduce an amount of high-frequency ripple that may be present in the VCO control signal VHF. The value of capacitance Cd is preferably chosen to be substantially less than capacitance Cf, thereby minimizing the effect of capacitor 216 on the second order characteristics of the loop filter (e.g., loop stability, loop bandwidth, etc.). In a preferred embodiment of the invention, capacitance Cd is selected to be a factor of about 100 less than capacitance Cf (e.g., about 15 pF). Consequently, the amount of leakage produced by capacitor 216 will be significantly less compared to capacitor 218 for a given voltage across the two capacitors.

Figure 3A:
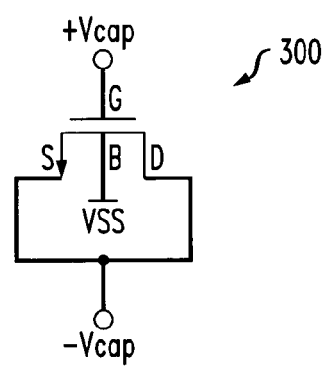
FIG. 3A is a schematic diagram illustrating an exemplary thick-oxide NMOS device configured for use as a capacitor.

Without loss of generality, FIG. 3A is a schematic diagram illustrating an exemplary thick-oxide NMOS device configured for use as a capacitor. It is to be appreciated that a thick-oxide P-type MOSFET (PMOS) device may be similarly used. Thick-oxide devices, for example, MOSFET devices having a gate oxide thickness greater than about 50 angstroms, are readily available in a conventional mixed signal CMOS fabrication process. Such thick-oxide MOSFETs are often employed, for example, as input/output (I/O) devices in an I/O portion of an IC. Since these thick-oxide devices are suitable for use with the present invention without modification of the conventional IC fabrication process, the cost of manufacturing the PLL is considerably lower than conventional methodologies for reducing leakage current in the loop filter.

As is apparent from the figure, the NMOS device 300 includes a gate terminal (G), a source terminal (S), a drain terminal (D) and a bulk terminal (B). The gate terminal of the NMOS device 300 forms a first terminal +Vcap of the capacitor, and the source and drain terminals are connected together to form a second terminal –Vcap of the capacitor. Generally, for an NMOS device in an N-well technology, the bulk terminal is fixed at the potential that the substrate is held to, which may be VSS. Moreover, –Vcap is preferably also at VSS, so that the bulk, source and drain terminals are held at the same potential. Therefore, no diode junctions in the NMOS device turn on.

As previously stated, employing thick-oxide MOSFET devices for implementing at least capacitor 218 in the loop filter 208 results in a significant reduction in leakage current generated by gate oxide tunneling. However, thick-oxide MOSFET devices generally have a much lower capacitance per unit area compared to thin-oxide MOSFET devices configured in a similar manner. Furthermore, thick-oxide MOSFET devices have a larger threshold voltage compared to thin-oxide MOSFET devices. Consequently, the voltage dependence of these thick-oxide MOSFETs is such that they exhibit a substantially lower capacitance in a greater portion of the operational voltage range of the devices compared to thin-oxide MOSFETs.

Figure 3B:
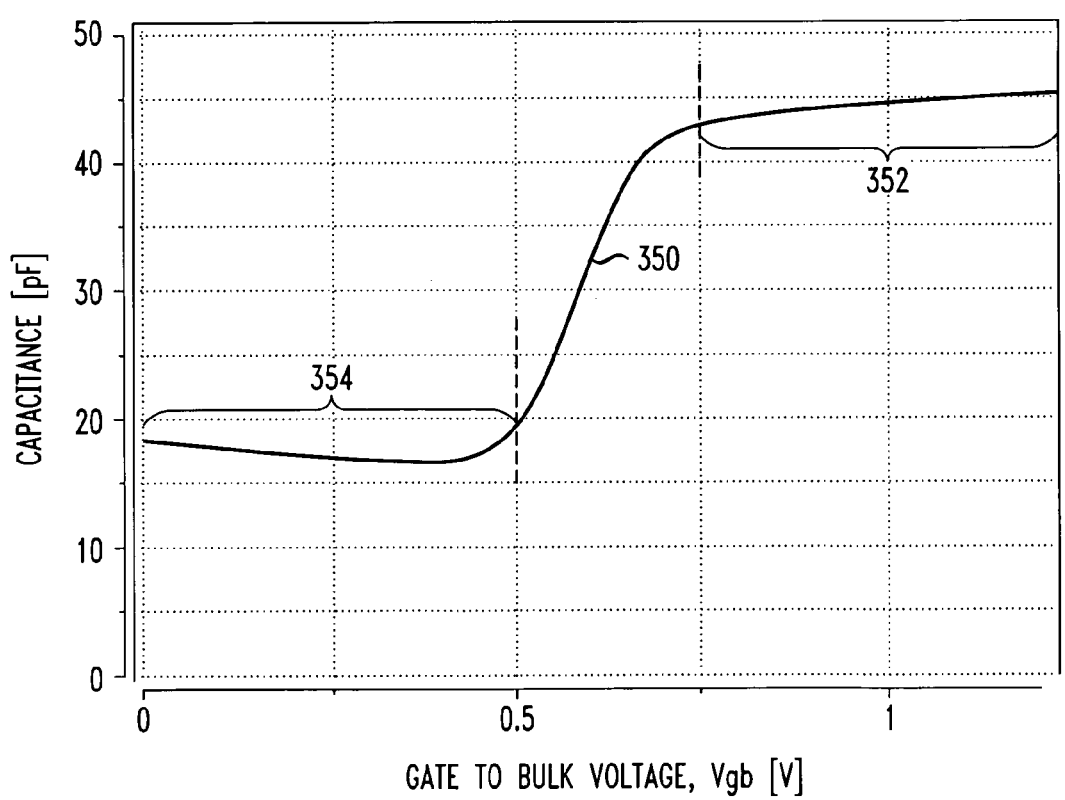
FIG. 3B is a graph depicting an exemplary plot of capacitance as a function of voltage associated with the illustrative thick-oxide NMOS device shown in FIG. 3A.

By way of example only, FIG. 3B is a an illustrative plot 350 of capacitance as a function of gate-to-bulk voltage (Vgb) across the thick-oxide NMOS device 300 shown in FIG. 3A. As apparent from FIG. 3B, when Vgb is greater than about 0.75 volts (V), the capacitance of the device is relatively high, such as, for example, greater than about 43 pF. This may be referred to herein as a high-capacitance region of operation, denoted as region 352 in the figure. The capacitance value of the NMOS device operating in the high-capacitance region 352 is dominated primarily by the parameter Cox, where Cox is the capacitance per unit area of the gate of the NMOS device. As the voltage Vgb across the device decreases to less than about 0.5 volts (e.g., close to the threshold voltage of the device), the capacitance of the device drops sharply and remains relatively low, such as, for example, less than about 20 pF. This may be referred to herein as a low-capacitance region of operation, denoted as region 354 in the figure. The capacitance value of the NMOS device operating in the low-capacitance region 354 is dominated primarily by Cox in series with Cbulk, where Cbulk is the bulk-to-substrate capacitance of the NMOS device.

Referring again to FIG. 2, an important aspect of the present invention is that the thick-oxide NMOS devices used to implement at least capacitor 218, and preferably capacitor 216 as well, are each biased at a substantially constant operating point which substantially maximizes a capacitance per unit area of the device, such as, for example, by biasing one or both capacitors 218, 216 in the high-capacitance region 352 shown in FIG. 3B. In this manner, smaller area thick-oxide devices can be used to implement the loop filter capacitors, thereby minimizing an overall area of the loop filter. Although the voltage across capacitor 216 may vary with the VCO control signal VHF, capacitor 216 is essentially only used for high frequency filtering of the VCO control signal VHF and is not used to control the loop filter characteristics. Consequently, it is not as critical that capacitor 216 be biased in a high-capacitance region of operation, nor is it a requirement that the capacitance Cd remain substantially constant during operation of the PLL. In fact, when the PLL is locked, the voltage across capacitor 216 will be substantially constant since at lock the charge pump 204 generates substantially no pulses.

In order to substantially maximize the capacitance per unit area of the thick-oxide NMOS device used to implement at least capacitor 218, the loop filter 208 preferably comprises a bias circuit, which may include a transconductance (gm) amplifier 222 and a capacitor 224 having a capacitance Cg coupled to an output of the transconductance amplifier. The bias circuit is configured to maintain a substantially constant reference voltage GMCREF across capacitor 218. Alternative amplifiers or circuit arrangements, such as, but not limited to, an operational amplifier (op-amp), may also be employed. The transconductance amplifier 222 and capacitor 224, together, function as a gm-C stage, with capacitor 224 being used, at least in part, to integrate an output current generated by the amplifier. In a preferred embodiment, capacitance Cg of capacitor 224 is about 50 pF, although the invention is not limited to this value.

Transconductance amplifier 222 preferably includes a first input, which may be a non-inverting (+) input, for receiving a voltage VCF across capacitor 218, and a second input, which may be an inverting (−) input, for receiving the reference voltage GMCREF. The transconductance amplifier 222 is preferably configured such that the voltage VCF across capacitor 218 is forced to be substantially equal to the reference voltage GMCREF, thereby forming a virtual short circuit between the first and second inputs of the amplifier. When the PLL 200 is locked, there is ideally no difference between the reference voltage GMCREF and the voltage VCF across capacitor 218. The reference voltage GMCREF is preferably selected so as to ensure that the thick-oxide NMOS device used to implement capacitor 218 remains predominantly in the high-capacitance region of operation. In a preferred embodiment of the invention, GMCREF is about 0.75 volts for a 1.2 volt power supply voltage.

The reference voltage GMCREF presented to the transconductance amplifier 222 may be generated locally within the loop filter 208, such as by a bandgap reference or alternative reference circuit (not shown). In this manner, the reference voltage GMCREF can be designed to substantially track variations in one or more environmental conditions, such as, but not limited to, temperature and IC process parameters. Alternatively, the reference voltage GMCREF may be generated externally with respect to the loop filter 208, such as by an external global reference circuit (not shown).

As will be understood by those skilled in the art, the transconductance amplifier 222 is designed to generate a current output Iout that is proportional to a difference between the respective voltages at the first and second inputs of the amplifier. Thus, the current Iout can be determined as $$Iout = gm \cdot (VCF - GMCREF),$$

where gm is a transconductance of amplifier 222. Preferably, the transconductance of amplifier 222 is substantially low, such as, for example, about 0.5 micromho, so as to keep the gm/Cg path at a substantially low frequency (e.g., about 1.6 KHz). Furthermore, by minimizing the transconductance of amplifier 222, capacitance Cg can be reduced accordingly, thereby minimizing the area consumed by capacitor 224, as well as reducing leakage current. If the amplifier 222 exhibits significant transconductance and high input impedance, it is often referred to as an operational transconductance amplifier (OTA). A more detailed discussion of transconductance amplifiers in general is presented, for example, in Alan B. Grebene, "Bipolar and MOS Analog Integrated Circuit Design," pp. 375–383 (John Wiley & Sons 1984), previously incorporated by reference herein.

In accordance with another aspect of the invention, even when thin-oxide MOSFET devices are used to implement the loop filter capacitors 216 and 218, the techniques of the invention described herein may be used to provide a beneficial reduction in leakage current in the loop filter caused by gate oxide tunneling. Since tunneling leakage current in a thin-oxide MOSFET device is strongly dependent on the voltage across the device, the bias circuit in the loop filter 208 can be configured to bias the thin-oxide device at a low enough voltage so as to reduce the leakage current to a desired acceptable level. This can be accomplished without modification of the bias circuit by simply adjusting the reference voltage GMCREF applied to the transconductance amplifier 222.

As shown in FIG. 2, the PLL 200 may optionally be configured for receiving one or more control signals, such as, for example, CI<2:0>, CR<2:0>, RST_VCO and RANGE, for selectively controlling one or more characteristics of the PLL. For instance, the charge pump 204 may be configurable for selectively controlling the charge pump current Icp in response to the control signals CI<2:0>. In a preferred embodiment of the invention, one or more of the control signals are digital signals. By way of example only, the current pump current Icp generated by the charge pump 204 may be set according to the following relation:

$$Icp = Icpo \cdot (1 + 4 \cdot CI\langle 2\rangle + 2 \cdot CI\langle 1\rangle + CI\langle 0\rangle),$$

where Icpo is a reference current value. Likewise, control signals CR<2:0> may be used to selectively control the loop filter resistance value Rf, and thus control the bandwidth of the loop filter 208, control signal RST_VCO may be used to set the control inputs presented to the VCO 206 to a known value, and control signal RANGE may be used to selectively control a gain of the VCO, as will be understood by those skilled in the art. It is to be appreciated that the PLL 200 is not limited to the number and type of control inputs shown, nor is it limited to the characteristics that may be selectively controlled in response to the control signals presented thereto.

While the present invention is described above with reference to thick-oxide NMOS devices, it is to be understood that a thick-oxide P-type MOS (PMOS) device could also be employed by simply substituting opposite polarities to those given for the NMOS embodiment, with suitable biasing modification thereto as will be apparent to those skilled in the art. The techniques and advantages of the present invention will similarly apply to the alternative embodiment(s).

In accordance with another aspect of the invention, one or more loop filters configured for implementing the techniques of the invention described herein, may be embodied in at least a portion of an IC. Likewise, one or more PLLs may be embodied in at least a portion of an IC, at least one of the PLLs including a loop filter configured in accordance with the techniques of the present invention set forth herein.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A loop filter for use in a phase-locked loop circuit, the loop filter comprising:
    a resistive element;
    at least one metal-oxide-semiconductor (MOS) transistor configured as a capacitor having a first capacitance associated therewith, the at least one MOS transistor being connected between a voltage source and an input of the loop filter via the resistive element; and
    a bias circuit connected to the at least one MOS transistor, the bias circuit being configured for maintaining a substantially constant reference voltage across the MOS transistor, the reference voltage biasing the at least one MOS transistor in a designated region of operation wherein a capacitance per unit area of the at least one MOS transistor is optimized.

2. The loop filter of claim 1, wherein the at least one MOS transistor comprises a thick-oxide MOS device, and wherein the reference voltage is selected to substantially maximize the first capacitance per unit area.

3. The loop filter of claim 1, wherein the at least one MOS transistor comprises a thick-oxide NMOS device, and wherein the reference voltage is greater than or about equal to a magnitude of a difference between a threshold voltage of the MOS transistor and the voltage source.

4. The loop filter of claim 1, wherein the at least one MOS transistor comprises a thick-oxide PMOS device, and wherein the reference voltage is less than or about equal to a magnitude of a difference between a threshold voltage of the MOS transistor and the voltage source.

5. The loop filter of claim 1, wherein the designated region of operation for biasing the at least one MOS transistor comprises a high-capacitance region in which the first capacitance is substantially maximized per unit area.

6. The loop filter of claim 1, wherein the at least one MOS transistor comprises a thin-oxide MOS device, the bias circuit being configured for maintaining the substantially constant reference voltage across the at least one MOS transistor, the reference voltage being selected so as to substantially minimize a tunneling leakage current in the at least one MOS transistor.

7. The loop filter of claim 1, wherein the voltage source is ground.

8. The loop filter of claim 1, wherein the bias circuit comprises an amplifier including a first input for receiving a voltage across the at least one MOS transistor, a second input for receiving the reference voltage, and an output for generating a signal proportional to a difference between the respective voltages at the first and second inputs of the amplifier.

9. The loop filter of claim 8, wherein the amplifier comprises a transconductance amplifier, the loop filter further comprising a second capacitance including a first terminal coupled to the output of the amplifier and a second terminal coupled to the voltage source.

10. The loop filter of claim 1, further comprising a second MOS transistor configured as a capacitor having a second capacitance associated therewith, the second MOS transistor being connected between the input of the loop filter and the voltage source and in parallel with the first MOS transistor.

11. The loop filter of claim 10, wherein the second capacitance is substantially less than the first capacitance.

12. The loop filter of claim 10, wherein the second capacitance is about 100 times less than the first capacitance.

13. The loop filter of claim 1, wherein the voltage source is one of a positive supply voltage and a negative supply voltage of the loop filter.

14. The loop filter of claim 1, wherein the resistive element comprises at least one resistor.

15. The loop filter of claim 1, wherein the resistive element comprises at least one MOS transistor biased in a substantially linear region of operation.

16. A phase-locked loop circuit, comprising:
    a variable frequency generator including a first input for receiving a first control signal presented thereto, a second input for receiving a second control input presented thereto, and an output for generating an output signal having a frequency associated therewith which varies as a function of the first and second control signals;
    a phase-frequency detector including a first input for receiving a reference signal having a reference frequency associated therewith, a second input for receiving at least a portion of the output signal from the variable frequency generator, and an output for generating the first control signal, the first control signal being representative of a difference between the reference frequency and the frequency of the output signal; and
    a loop filter including an input for receiving the first control signal and an output for generating the second control signal, the loop filter comprising:
        a resistive element;

at least one metal-oxide-semiconductor (MOS) transistor configured as a capacitor having a first capacitance associated therewith, the at least one MOS transistor being connected between a voltage source and an input of the loop filter via the resistive element; and a bias circuit connected to the at least one MOS transistor, the bias circuit being configured for maintaining a substantially constant reference voltage across the MOS transistor, the reference voltage biasing the at least one MOS transistor in a designated region of operation wherein a capacitance per unit area of the at least one MOS transistor is optimized.

17. The circuit of claim 16, wherein the at least one MOS transistor in the loop filter comprises a thick-oxide MOS device, and wherein the reference voltage is selected to substantially maximize the first capacitance per unit area.

18. The circuit of claim 16, wherein the designated region of operation for biasing the at least one MOS transistor in the loop filter comprises a high-capacitance region in which the first capacitance is substantially maximized per unit area.

19. The circuit of claim 16, wherein the bias circuit in the loop filter comprises an amplifier including a first input for receiving a voltage across the at least one MOS transistor, a second input for receiving the reference voltage, and an output for generating a signal proportional to a difference between the respective voltages at the first and second inputs of the amplifier.

20. An integrated circuit including at least one loop filter, the at least one loop filter comprising:

a resistive element;

at least one metal-oxide-semiconductor (MOS) transistor configured as a capacitor having a first capacitance associated therewith, the at least one MOS transistor being connected between a voltage source and an input of the loop filter via the resistive element; and a bias circuit connected to the at least one MOS transistor, the bias circuit being configured for maintaining a substantially constant reference voltage across the MOS transistor, the reference voltage biasing the at least one MOS transistor in a designated region of operation wherein a capacitance per unit area of the at least one MOS transistor is optimized.

21. The integrated circuit of claim 20, wherein the at least one MOS transistor in the at least one loop filter comprises a thick-oxide MOS device, and wherein the reference voltage is selected to substantially maximize the first capacitance per unit area.

22. The integrated circuit of claim 20, wherein the designated region of operation for biasing the at least one MOS transistor in the at least one loop filter comprises a high-capacitance region in which the first capacitance is substantially maximized per unit area.

23. An integrated circuit including at least one phase-locked loop, the at least one phase-locked loop comprising:

a variable frequency generator including a first input for receiving a first control signal presented thereto, a second input for receiving a second control input presented thereto, and an output for generating an output signal having a frequency associated therewith which varies as a function of the first and second control signals;

a phase-frequency detector including a first input for receiving a reference signal having a reference frequency associated therewith, a second input for receiving at least a portion of the output signal from the variable frequency generator, and an output for generating the first control signal, the first control signal being representative of a difference between the reference frequency and the frequency of the output signal; and a loop filter including an input for receiving the first control signal and an output for generating the second control signal, the loop filter comprising:

a resistive element;

at least one metal-oxide-semiconductor (MOS) transistor configured as a capacitor having a first capacitance associated therewith, the at least one MOS transistor being connected between a voltage source and an input of the loop filter via the resistive element; and a bias circuit connected to the at least one MOS transistor, the bias circuit being configured for maintaining a substantially constant reference voltage across the MOS transistor, the reference voltage biasing the at least one MOS transistor in a designated region of operation wherein a capacitance per unit area of the at least one MOS transistor is optimized.

* * * * *